(12) United States Patent
Chiu et al.

(10) Patent No.: US 6,440,779 B1
(45) Date of Patent: Aug. 27, 2002

(54) SEMICONDUCTOR PACKAGE BASED ON WINDOW PAD TYPE OF LEADFRAME AND METHOD OF FABRICATING THE SAME

(75) Inventors: Fly Chiu, Tantzu; Audi Chen; Tzong-Da Ho, both of Taichung, all of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/859,098

(22) Filed: May 16, 2001

(51) Int. Cl.⁷ ............................................... H01L 21/48
(52) U.S. Cl. ...................... 438/123; 257/666; 257/667; 257/712; 257/787
(58) Field of Search ................................ 257/666, 669, 257/787; 438/123

(56) References Cited

U.S. PATENT DOCUMENTS

| | | | |
|---|---|---|---|
| 5,140,404 A | | 8/1992 | Fogal et al. ................. 257/783 |
| 5,491,362 A | * | 2/1996 | Hamzehdoost et al. ...... 257/712 |
| 6,114,752 A | * | 9/2000 | Huang et al. ................. 257/666 |
| 6,191,490 B1 | * | 2/2001 | Huang ........................... 257/782 |

* cited by examiner

Primary Examiner—Hoai Ho
Assistant Examiner—Tu-Tu Ho
(74) Attorney, Agent, or Firm—Peter F. Corless; Steven M. Jensen; Edwards & Angell, LLP

(57) ABSTRACT

A new semiconductor packaging technology is proposed for the fabrication of a semiconductor package based on window pad type of leadframe. The proposed semiconductor packaging technology is characterized by the mounting of a window shim having a solid ring portion and a hollowed window portion over the die pad of the leadframe. The window shim is dimensioned in such a manner that the width of the ring portion thereof is larger than the width of the window portion of the die pad of the leadframe, while the width of the window portion of the window shim is smaller than the width of the semiconductor chip. This feature allows one design of the window pad type of leadframe to be universally suited for packaging semiconductor chips of various sizes. Moreover, the incorporation of the window shim additionally allows an increase in the heat-dissipation efficiency of the packaged chip.

16 Claims, 3 Drawing Sheets

SEMICONDUCTOR PACKAGE BASED ON WINDOW PAD TYPE OF LEADFRAME AND METHOD OF FABRICATING THE SAME

BACKGROUND OF THE INVENTION

1. Field of the Invention

This invention relates to semiconductor packaging technology, and more particularly, to a semiconductor package based on window pad type of leadframe and method of fabricating the same.

2. Description of Related Art

A leadframe is a metal-made frame that includes a centrally-located die pad and a plurality of peripherally-located leads surrounding the die pad. The die pad is used for mounting a semiconductor chip thereon, while the leads are used to serve as external connecting means for the semiconductor chip. After the semiconductor chip is wire-bonded to the leads, the die pad together with the semiconductor chip are encapsulated in an epoxy-molded compound (EMC), or called encapsulation body.

A window pad type of leadframe is one of the many various kinds of leadframes that are used for construction of semiconductor packages. This type of leadframe is characterized by the provision of an opening (or called window) in the center of the die pad and can help to prevent delamination of the mounted chip. A conventional method for fabricating a semiconductor package based on a window pad type of leadframe is illustratively depicted in the following with reference to FIGS. 1A–1D.

FIG. 1A shows a schematic diagram in top view of a window pad type of leadframe 100, while FIG. 1B shows the same in sectional view cutting through the line 1B—1B. As shown, this window pad type of leadframe 100 includes a plurality of peripherally-located leads 110 and a centrally-located die pad 120 having a solid ring portion 121 and a hollowed window portion 122. The leadframe 100 is typically made of copper.

The leadframe 100 is used to serve as a chip carrier for a semiconductor chip 140. It is to be noted that the width $W_1$ of the semiconductor chip 140 should be larger than the width $W_0$ of the window portion 122 of the die pad 120.

Referring further to FIG. 1C, in the next step, a die-mounting process is performed to mount the semiconductor chip 140 over the die pad 120 by adhering the semiconductor chip 140 to the ring portion 121 of the die pad 120 with a thermally-conductive adhesive layer 141, such as silver epoxy.

Referring further to FIG. 1D, in the next step, a wire-bonding process is performed to electrically couple the semiconductor chip 140 to the leads 110 of the leadframe 100 by means of a plurality of bonding wires 150, such as gold wires. Finally, an encapsulation process is performed to form an encapsulation body 160 to encapsulate the semiconductor chip 140. This completes the fabrication of the semiconductor package.

The reason for the provision of the window portion 122 in the die pad 120 of the leadframe 100 is that it can help prevent the delamination of the semiconductor chip 140 from the die pad 120. Otherwise, since the die pad 120 is greatly different in coefficient of thermal expansion (CTE) from the semiconductor chip 140 (the CTE of the semiconductor chip 140 is typically from 3 ppm/° C. to 4 ppm/° C., while the CTE of the copper-made die pad 120 is typically from 16 ppm/° C. to 20 ppm/° C.), it would easily make the semiconductor chip 140 subjected to delamination from the die pad 120 while undergoing high-temperature process steps.

In practical applications, however, the foregoing method for fabricating a semiconductor package based on a window pad type of leadframe would have the following drawbacks.

First, each design of the leadframe 100 is only suited for the packaging of semiconductor chips of specific sizes that are larger than the width $W_0$ of the window portion 122 of the die pad 120. For chips that are smaller in width than $W_0$, a new leadframe design is apparently required, and which is quite cost-ineffective to implement. There exists therefore a need for a new method that allows one design of the leadframe 100 to be universally suited for packaging chips of various sizes, whether larger or smaller than the window size.

Second, the existence of the window portion 122 of the die pad 120 reduces the contact area between the semiconductor chip 140 and the die pad 120, resulting in a reduced heat-dissipation efficiency through the die pad 120.

Related patents, include, for example, the U.S. Pat. No. 5,140,404 entitled "SEMICONDUCTOR DEVICE MANUFACTURED BY A METHOD FOR ATTACHING A SEMICONDUCTOR DIE TO A LEADFRAME USING A THERMOPLASTIC COVERED CARRIER TAPE". This patented technology, however, teaches no solutions to the above-mentioned two drawbacks.

SUMMARY OF THE INVENTION

It is therefore an objective of this invention to provide an improved semiconductor packaging technology for fabricating a semiconductor package based on a window pad type of leadframe, which allows one design of the window pad type of leadframe to be universally suited for packaging chips of various sizes.

It is another objective of this invention to provide an improved semiconductor packaging technology for fabricating a semiconductor package based on a window pad type of leadframe, which allows an increase in the heat-dissipation efficiency of the packaged chip as compared to the prior art.

In accordance with the foregoing and other objectives, the invention proposes a new semiconductor packaging technology for fabricating a semiconductor package based on a window pad type of leadframe.

In terms of method, the semiconductor packaging technology according to the invention comprises the following steps: (1) preparing a leadframe including a plurality of leads and a die pad having a solid ring portion and a hollowed window portion; the window portion of the leadframe having a predefined size; (2) mounting a window shim having a solid ring portion and a hollowed window portion over the die pad of the leadframe; (3) mounting a semiconductor chip over the window shim and (4) performing a wire-bonding process to electrically couple the semiconductor chip to the leads of the leadframe; and (5) performing an encapsulation process to form an encapsulation body to encapsulate the semiconductor chip.

In terms of structure, the semiconductor packaging technology according to the invention comprises the following constituent parts: (a) a leadframe including a plurality of leads and a die pad having a solid ring portion and a hollowed window portion; the window portion of the leadframe having a predefined size; (b) a window shim having a solid ring portion and a hollowed window portion, and whose ring portion is attached to the ring portion of the die pad of the leadframe; (c) a semiconductor chip mounted over the window shim; (d) a plurality of bonding wires for electrically coupling the semiconductor chip to the leads of the leadframe; and (e) an encapsulation body for encapsulating the semiconductor chip.

The semiconductor packaging technology according to the invention is characterized by the provision of the window shim over the die pad of the leadframe. The window shim is dimensioned in such a manner that the width of the ring portion thereof is larger than the width of the window portion of the die pad of the leadframe, while the width of the window portion of the window shim is smaller than the width of the semiconductor chip. This feature allows one design of the window pad type of leadframe to be universally suited for packaging semiconductor chips of various sizes. Moreover, the incorporation of the window shim additionally allows an increase in the heat-dissipation efficiency of the packaged chip.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The semiconductor packaging technology according to the invention for fabricating a semiconductor package based on a window pad type of leadframe is disclosed in full details by-way of preferred embodiments in the following with reference to FIGS. 2A–2D.

Figure 1A:
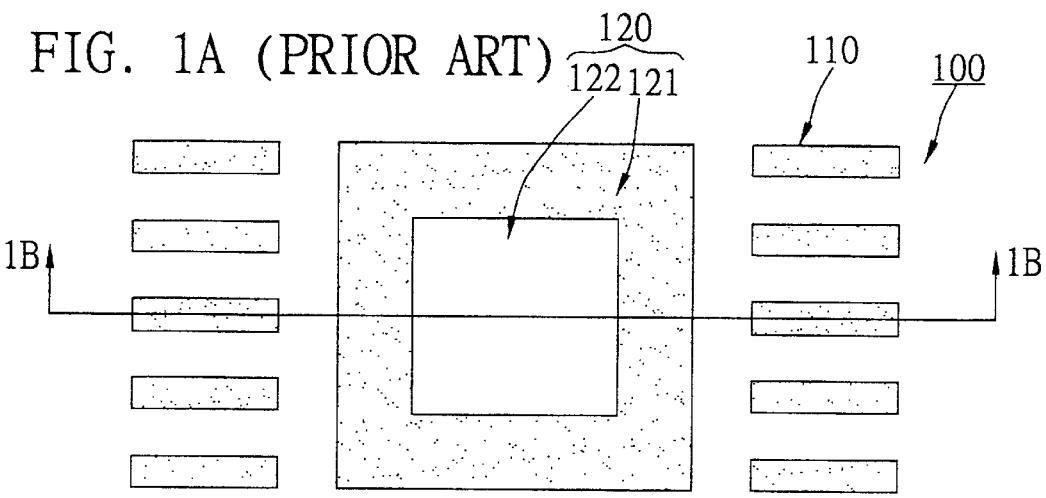
FIGS. 1A–1D (PRIOR ART) are schematic diagrams used to depict the procedural steps invoked in a conventional method for fabricating a semiconductor package based on a window pad type of leadframe.
Figure 1B:
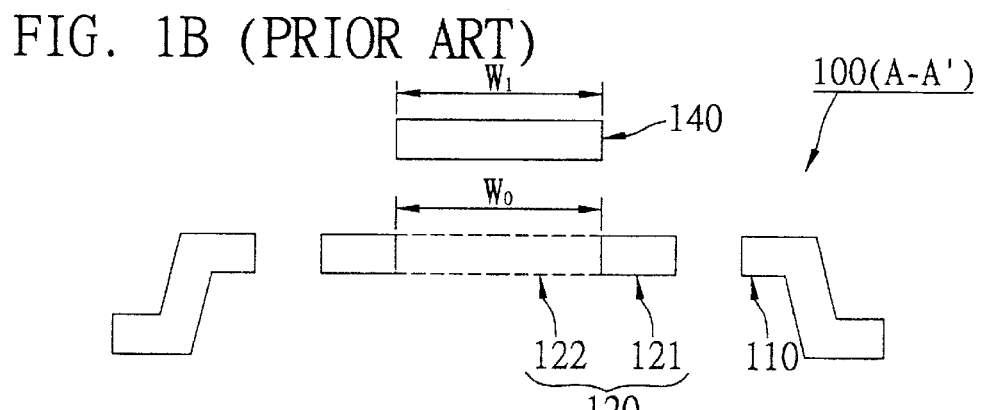
Figure 1C:
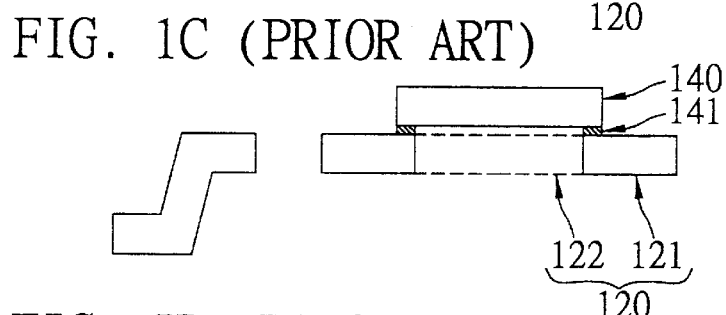
Figure 1D:
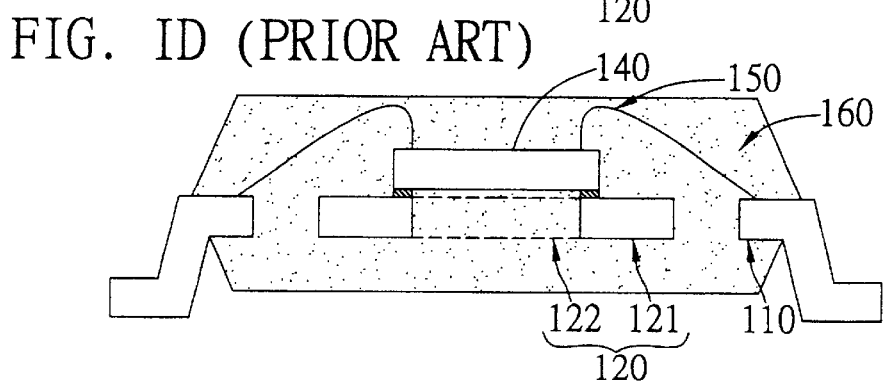
Figure 2A:
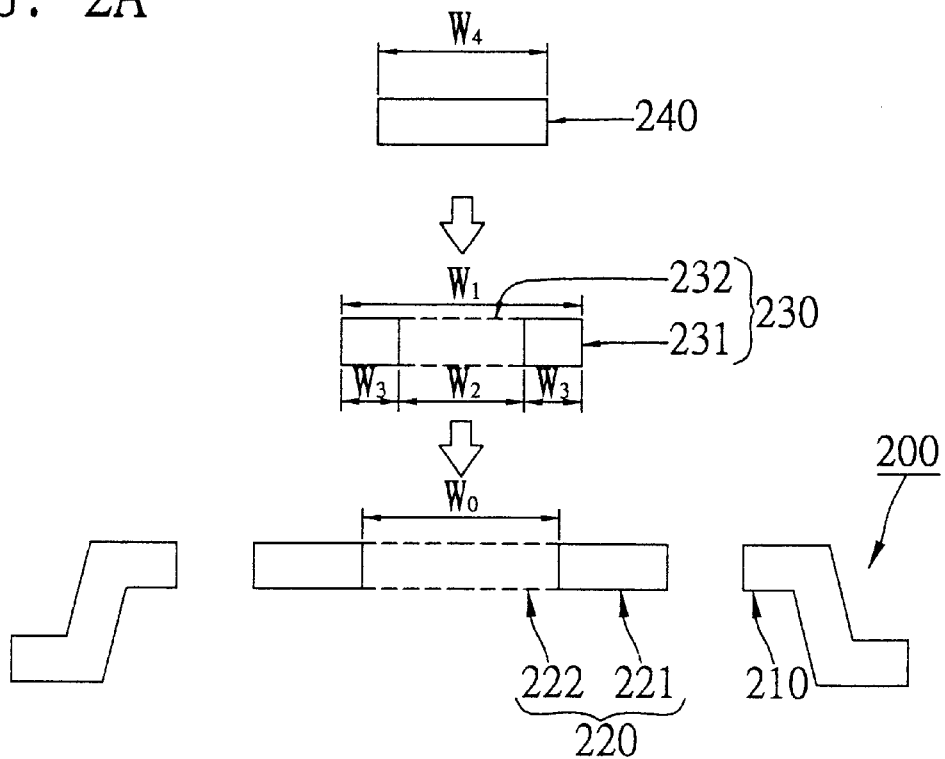
FIGS. 2A–2D a schematic diagrams used to depict the procedural steps involved in the method according to the invention for fabricating a semiconductor package based on a window pad type of leadframe.

Referring first to FIG. 2A, by the semiconductor packaging technology according to the invention, the first step is to prepare a window pad type of leadframe 200 and a window shim 230 for packaging a semiconductor chip 240.

The window pad type of leadframe 200 includes a plurality of peripherally-located leads 210 and a centrally-located die pad 220 having a solid ring portion 221 and a hollowed window portion 222.

The window shim 230 has a solid ring portion 231 and a hollowed window portion 232. It is to be noted that the width $W_1$ of the ring portion 231 of the window shim 230 should be larger than the width $W_0$ of the window portion 222 of the die pad 220, while the width $W_2$ of the window portion 232 of the window shim 230 should be smaller than the width $W_4$ of the semiconductor chip 240. Moreover, the width $W_3$ of the ring portion 231 of the window shim 230 should be equal to or greater than 0.25 mm so as to be capable of providing firm support. Furthermore, the CTE of the window shim 230 should be between the CTE of the die pad 220 and the CTE of the semiconductor chip 240.

The semiconductor chip 240 can be either larger or smaller in its width $W_4$ than the Width $W_0$ of the window portion 222 of the die pad 220. In this embodiment, assume the width $W_4$ of the semiconductor chip 240 is smaller than the width $W_0$ of the window portion 222 of the die pad 220 (note particularly that the prior art of FIGS. 1A–1D is unable to package this chip size).

Figure 2B:
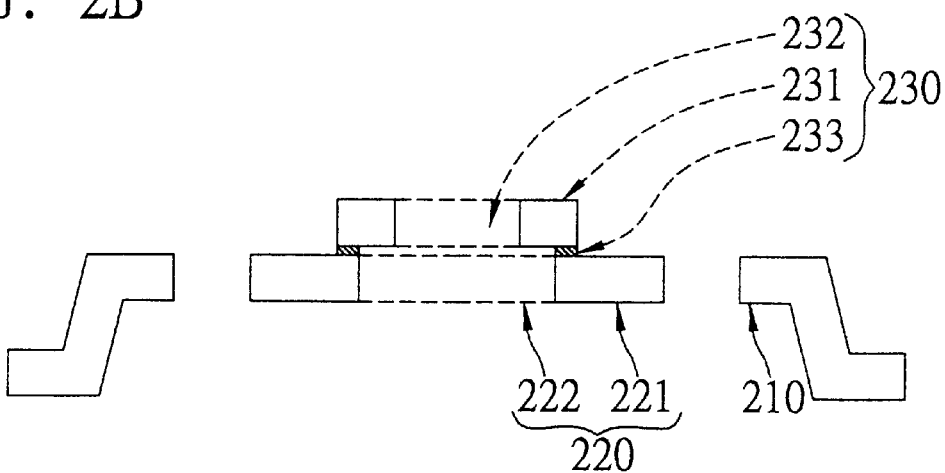

Referring further to FIG. 2B, in the next step, the window shim 230 is mounted over the die pad 220 of the leadframe 200 by aligning the window portion 232 thereof to the window portion 222 of the die pad 220 and adhering the ring portion 131 thereof to the ring portion 221 of the die pad 220 with a thermally-conductive adhesive layer 233, such as silver epoxy.

Figure 2C:
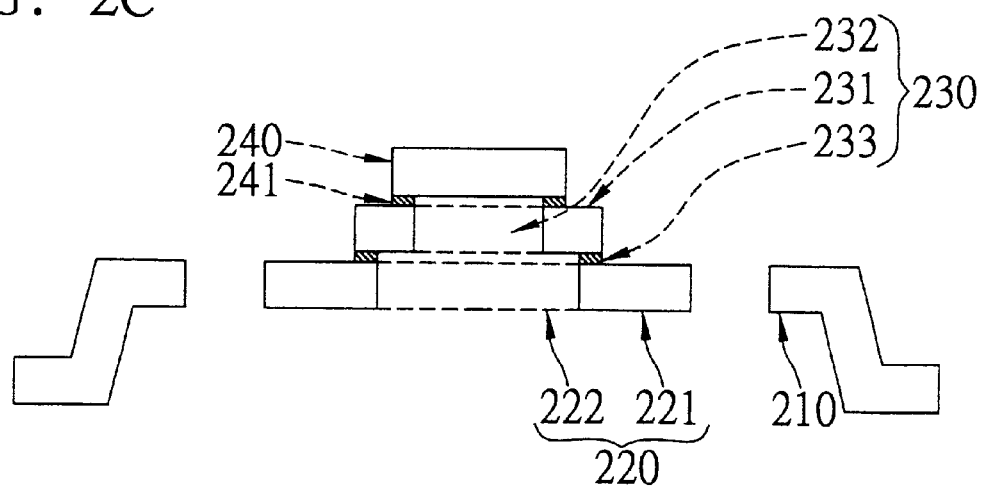

Referring further to FIG. 2C, in the next step, a die-mounting process is performed to mount the semiconductor chip 240 over the window shim 230 by adhering the semiconductor chip 240 to the ring portion 231 of the window shim 230 with a thermally-conductive adhesive layer 241, such as silver epoxy.

Figure 2D:
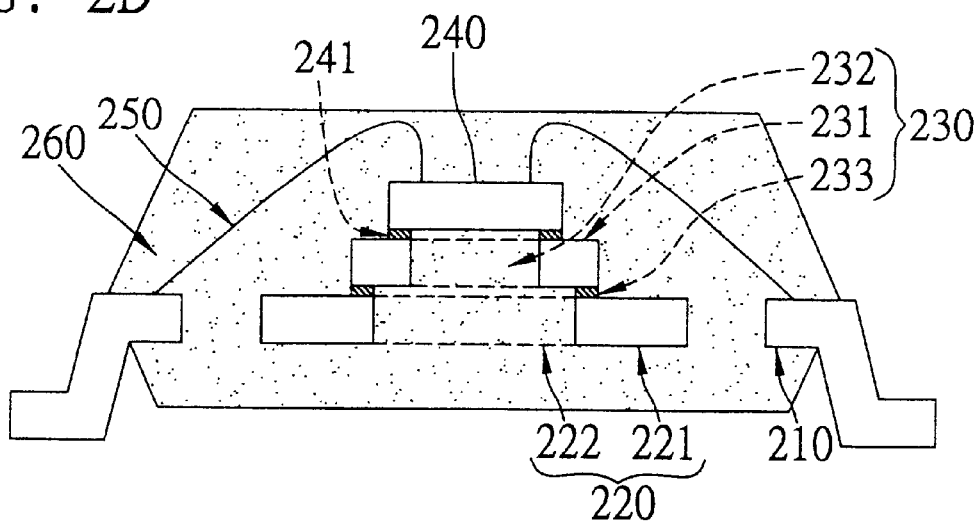

Referring further to FIG. 2D, in the next step, a wire-bonding process is performed to electrically couple the semiconductor chip 240 to the leads 210 of the leadframe 200 by means of a plurality of bonding wires 250, such as gold wires. Finally, an encapsulation process is performed to form an encapsulation body 260 to encapsulate the semiconductor chip 240. This completes the fabrication of the semiconductor package.

In conclusion, the invention provides a new semiconductor packaging technology for packaging a semiconductor chip of my various size over a window pad type of leadframe, which is characterized by the provision of a window shim over the die pad of the leadframe. This characteristic feature allows one design of the window pad type of leadframe to be universally suited for packaging semiconductor chips of various sizes. More- Moreover the incorporation of the window shim allows an increase in the heat-dissipation efficiency of the packaged chip.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package, comprising the steps of:
   (1) preparing a leadframe including a plurality of leads and a die pad having a solid ring portion and a hollowed window portion; the window portion of the leadframe having a predefined size;
   (2) mounting a window shim having a solid ring potion and a hollowed window portion over the die pad of the leadframe;
   (3) mounting a semiconductor chip over the window shim;
   (4) performing a wire-bonding process to electrically couple the semiconductor chip to the leads of the leadframe; and
   (5) performing an encapsulation process to form an encapsulation body to encapsulate the semiconductor chip.

2. The method of claim 1, wherein in said step (1), the leadframe is made of copper.

3. The method of claim 1, wherein in said step (2), the CTE of the window shim is between the CTE of the die pad and the CTE of the semiconductor chip.

4. The method of claim 1, wherein in said step (2), the window shim is mounted over the die pad of the leadframe by means of a thermally-conductive adhesive layer.

5. The method of claim 4, wherein the thermally-conductive adhesive layer is silver epoxy.

6. The method of claim 1, wherein in said step (3), the semiconductor chip is mounted over the window shim by means of a thermally-conductive adhesive layer.

7. The method of claim 6, wherein the thermally-conductive adhesive layer is silver epoxy.

8. The method of claim 1, wherein in said step (5), the bonding wires are gold wires.

9. A semiconductor package, which comprises:
   (a) a leadframe including a plurality of leads and a die pad having a solid ring portion and a hollowed window portion; the window portion of the leadframe having a predefined size;
   (b) a window shim having a solid ring portion and a hollowed window portion, and whose ring portion is attached to the ring portion of the die pad of the leadframe;
   (c) a semiconductor chip mounted over the window shim;
   (d) a plurality of bonding wires for electrically coupling the semiconductor chip to the leads of the leadframe; and
   (e) an encapsulation body for encapsulating the semiconductor chip.

10. The semiconductor package of claim 9, wherein the leadframe is made of copper.

11. The semiconductor package of claim 9, wherein the CTE of the window shim is between the CTE of the die pad and the CTE of the semiconductor chip.

12. The semiconductor package of claim 9, wherein the window shim is mounted over the die pad of the leadframe by means of a thermally-conductive adhesive layer.

13. The semiconductor package of claim 12, wherein the thermally-conductive adhesive layer is silver epoxy.

14. The semiconductor package of claim 9, wherein the semiconductor chip is mounted over the window shim by means of a thermally-conductive adhesive layer.

15. The semiconductor package of claim 14, wherein the thermally-conductive adhesive layer is silver epoxy.

16. The semiconductor package of claim 9, wherein the bonding wires are gold wires.

\* \* \* \* \*